(12) United States Patent
Fussell et al.

(10) Patent No.: US 11,054,472 B2
(45) Date of Patent: Jul. 6, 2021

(54) RELAY TEST PADDLE

(71) Applicant: AVO Multi-Amp Corporation, Dallas, TX (US)

(72) Inventors: Howard G. Fussell, Midlothian, TX (US); Eddie Bouasry, Arlington, TX (US)

(73) Assignee: AVO Multi-Amp Corporation, Dallas, TX (US)

( * ) Notice: Subject to any disclaimer, the term of this patent is extended or adjusted under 35 U.S.C. 154(b) by 11 days.

(21) Appl. No.: 16/107,577

(22) Filed: Aug. 21, 2018

(65) Prior Publication Data

US 2019/0064273 A1 Feb. 28, 2019

Related U.S. Application Data

(60) Provisional application No. 62/549,281, filed on Aug. 23, 2017.

(51) Int. Cl.
*G01R 31/327* (2006.01)
*G01R 1/04* (2006.01)

(52) U.S. Cl.
CPC ....... *G01R 31/3278* (2013.01); *G01R 1/0416* (2013.01)

(58) Field of Classification Search
CPC .......................... G01R 31/3278; G01R 1/0416
USPC ......................................... 324/418, 415, 424
See application file for complete search history.

(56) References Cited

U.S. PATENT DOCUMENTS

| | | |
|---|---|---|
| 1,490,336 A | 4/1924 | Lush |
| 2,253,223 A | 8/1941 | Blake |
| 3,052,866 A | 9/1962 | Koch |
| 3,282,096 A | 11/1966 | Bullard et al. |
| 3,355,659 A | 11/1967 | Burgess |
| 3,922,600 A | 11/1975 | Roveti |
| 4,365,861 A | 12/1982 | Gore |
| 4,843,445 A * | 6/1989 | Stemme ................ G01F 1/6845 257/470 |
| 5,149,278 A | 9/1992 | Waas et al. |
| 5,380,227 A | 1/1995 | Taylor |
| 5,713,765 A | 2/1998 | Nugent |
| 6,025,760 A | 2/2000 | Tang |
| 6,354,889 B1 | 3/2002 | Matsuda et al. |
| 6,379,197 B2 | 4/2002 | Matsuda et al. |

(Continued)

FOREIGN PATENT DOCUMENTS

DE 1296261 B 5/1969

OTHER PUBLICATIONS

Surplus Sales of Nebraska; "Binding Posts"; Retrieved from: http://www.surplussales.com/Connectors/banana.html; Nov. 3, 2002; 2 pages.
Megger; States Terminal Blocks & Test Switches; Retrieved from: https://www.statesproducts.com/common/documents/STATES_CAT_en_V14.pdf; Oct. 2015; 140 pages.
Office Action dated Dec. 2, 2004; U.S. Appl. No. 10/690,333 filed Oct. 21, 2003; 15 pages.

(Continued)

*Primary Examiner* — Giovanni Astacio-Oquendo
(74) *Attorney, Agent, or Firm* — Conley Rose, P. C.; J. Robert Brown, Jr.

(57) ABSTRACT

A test paddle is provided that includes a body portion having a first end and a second end. The test paddle includes a plurality of adapters provided about the second end and a plurality of contacts provided about the first end, each of the plurality of adapters electrically coupled to one of the plurality of contacts. The test paddle includes a removable insulation plate selectively attached to the body portion. A method for testing relays is also provided.

17 Claims, 5 Drawing Sheets

(56) References Cited

U.S. PATENT DOCUMENTS

| | | | |
|---|---|---|---|
| 6,450,842 | B1 | 9/2002 | Matsuda et al. |
| 6,604,209 | B1 * | 8/2003 | Grucci ................ G06F 11/3688 714/38.1 |
| 6,685,483 | B2 | 2/2004 | Blauvelt |
| 6,946,843 | B2 * | 9/2005 | Fussell ............. G01R 31/31712 324/418 |
| 8,211,559 | B1 * | 7/2012 | Waggoner ............ H01M 10/482 429/90 |
| 2001/0005658 | A1 | 6/2001 | Matsuda et al. |
| 2003/0100219 | A1 | 5/2003 | Dickens |
| 2006/0003640 | A1 | 1/2006 | Fussell et al. |
| 2014/0141643 | A1 * | 5/2014 | Panella .................... H04Q 1/13 439/391 |
| 2015/0362570 | A1 * | 12/2015 | Sakakura ........... G01R 33/4215 324/319 |
| 2016/0025830 | A1 * | 1/2016 | Roland .................. A61B 5/055 324/309 |
| 2016/0089029 | A1 * | 3/2016 | Biber .................. A61B 5/4312 600/422 |
| 2018/0124921 | A1 * | 5/2018 | Song ...................... H01R 13/11 |
| 2018/0351314 | A1 * | 12/2018 | Hsu .................. H01R 13/6658 |

OTHER PUBLICATIONS

Notice of Allowance dated Jun. 1, 2005; U.S. Appl. No. 10/690,333 filed Oct. 21, 2003; 9 pages.
Office Action dated Oct. 26, 2005; U.S. Appl. No. 11/221,476 filed Sep. 8, 2005; 6 pages
Final Office Action dated Feb. 14, 2006; U.S. Appl. No. 11/221,476 filed Sep. 8, 2005; 5 pages.
PCT International Search Report; Application No. PCT/US03/33357; dated Mar. 23, 2004; 4 pages.

\* cited by examiner

RELAY TEST PADDLE

CROSS-REFERENCE TO RELATED APPLICATIONS

This patent application claims benefit of U.S. Provisional Patent Application No. 62/549,281, filed Aug. 23, 2017, by Howard G. Fussell, et al., and titled "Relay Test Paddle," which is hereby incorporated by reference.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Switches and relays are frequently tested for a variety reasons, such as to ensure they are functioning properly. Various testing equipment may be utilized for these purposes, such as test boards that include a plurality of contacts that may be plugged into a relay for testing the switches of the relay. Banana jacks on a test board may communicate with the contacts to provide an attachment point for connecting test equipment to the test board.

BRIEF DESCRIPTION OF THE DRAWINGS

For a more complete understanding of the present disclosure and the advantages thereof, reference is now made to the following brief description, taken in connection with the accompanying drawings and detailed description, wherein like reference numerals represent like parts, in which.

DETAILED DESCRIPTION OF THE DISCLOSURE

It should be understood at the outset that although exemplary implementations of a test paddle are illustrated below, the present disclosure may be implemented using any number of techniques, whether currently known or in existence. The present disclosure should in no way be limited to the exemplary implementations, drawings, and techniques illustrated below, including the exemplary design and implementation illustrated and described herein.

Figure 1A:
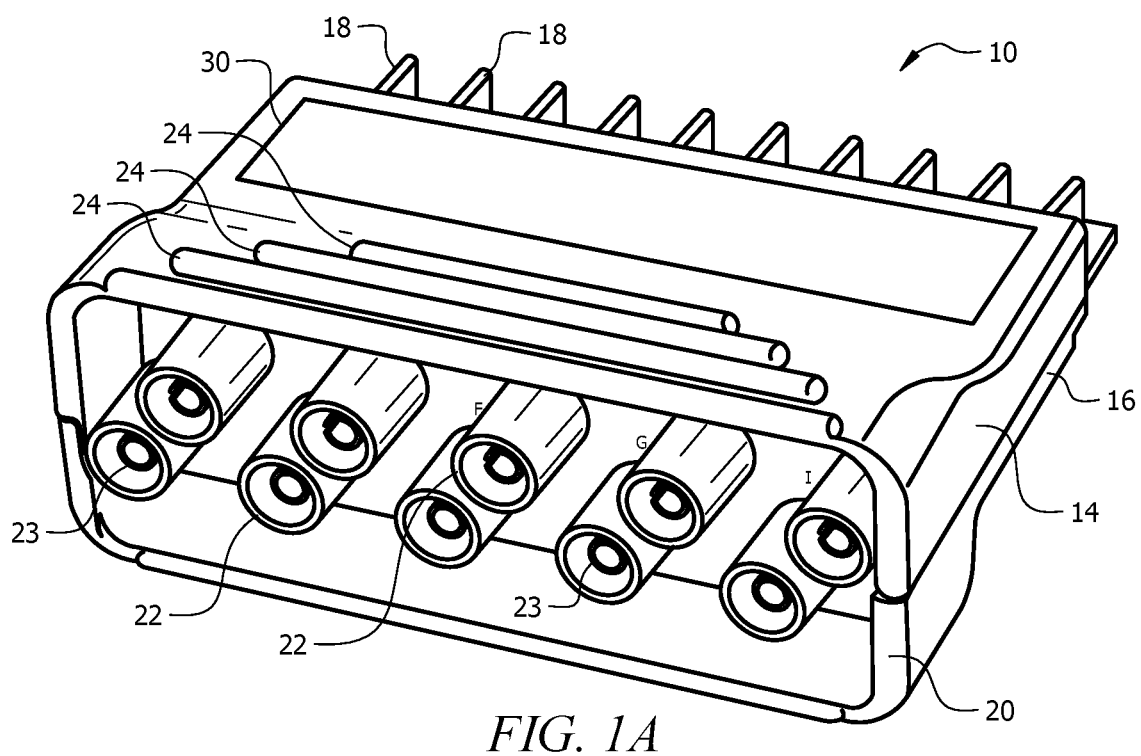
FIG. 1A depicts a test paddle for use with a test device in accordance with an embodiment of the present disclosure.
Figure 1B:
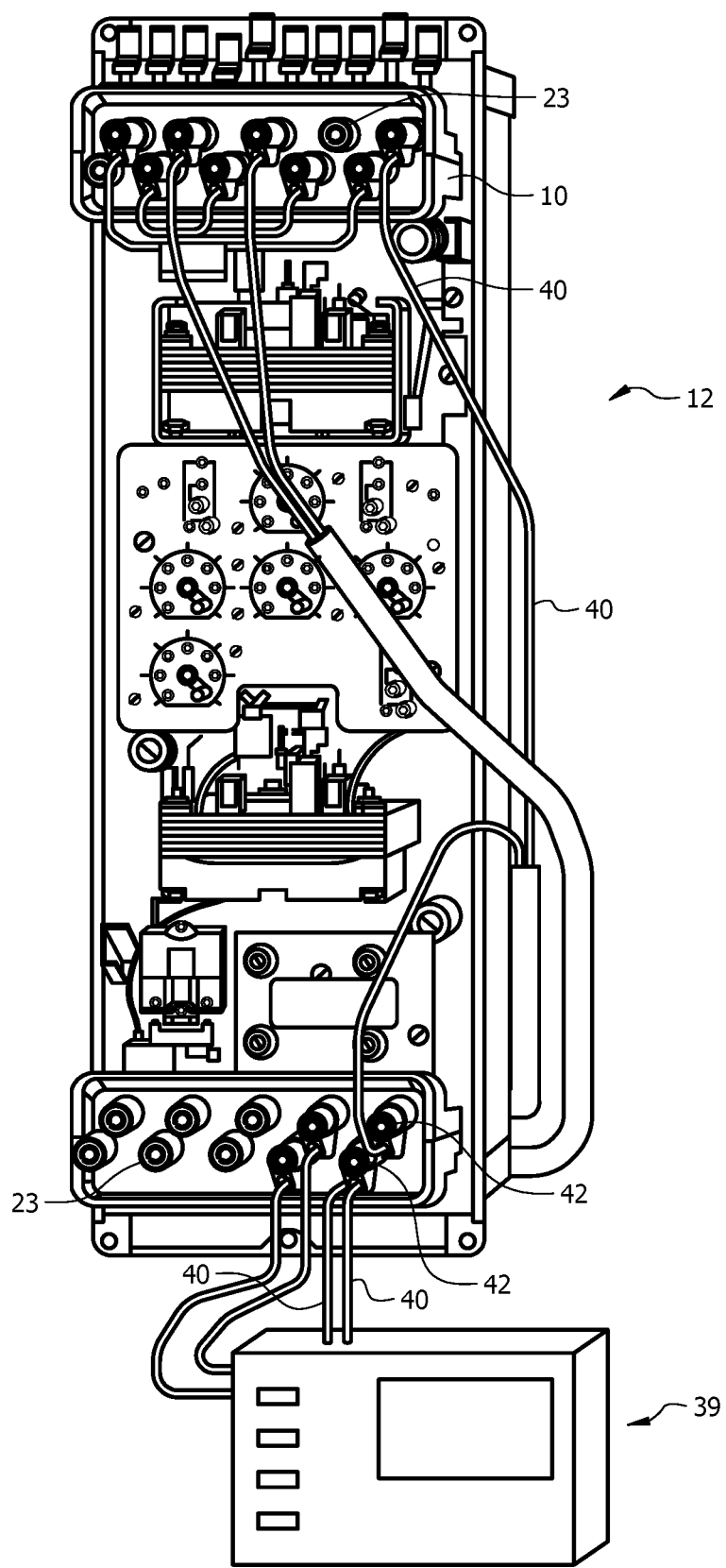
FIG. 1B depicts the test paddle shown connected to the test device and a relay tester in accordance with an embodiment of the present disclosure.

FIGS. 1A and 1B illustrate an embodiment of a test paddle 10 for testing equipment such as relays and switches of a test device 12, or device under test. FIGS. 2A-2D illustrate different views of the test paddle 10 illustrated in FIGS. 1A-1B, while FIG. 3 illustrates a perspective view of the test paddle 10 illustrated in FIGS. 1A-1B and 2A-2D. The test paddle 10 includes a body portion 14, which may be constructed of any suitable materials such as one or more non-conductive or insulating materials. For example, the body portion 14 may comprise PlusTek RA325G5 (or the like) in some aspects. In other aspects, the body portion 14 may comprise or one or more different types of polymers, thermoplastics, nylons, glass fibers, or the like. The body portion 14 includes a first end 16 comprising a plurality of contacts 18, which may be configured as rigid knife-type contacts 18 and/or a series of alternating flat contact blades 18A and L-shaped contact blades 18B such as shown in FIGS. 2C and 3. However, the contacts 18 may be configured according to any suitable manner in order to provide an electrical connection with the test device 12 in other aspects.

In some aspects, the contacts 18 may be constructed of electrically conductive material. The body portion 14 further includes a second end 20 comprising a plurality of insulators 22 surrounding banana jack adapters 23, which may be electrically coupled to the contacts 18. The insulators 22 and banana jack adapters 23 may comprise a tubular configuration such as shown. Generally speaking, however, the insulators 22 and/or banana jack adapters 23 as shown in this embodiment, may be configured using any suitable connector or adapter and comprise any suitable size and/or shape necessary to connect to the relay tester 39. While the test paddle 10 is depicted as having ten contacts 18 and banana jack adapters 23, the test paddle 10 may include more or less contacts 18 and banana jack adapters 23 in other implementations. Similarly, while the test device 12 shown in FIG. 1A includes ten switches, other test devices may include more or fewer switches. Furthermore, the test paddle 10 may be shaped and/or sized to accommodate test devices of other shapes, sizes, or configurations, as will readily suggest themselves to one skilled in the art in light of the present disclosure. The body portion 14 may also include ridged portions 24 and a label portion 30 which will be discussed in further detail herein.

FIG. 1B depicts the test paddle 10 shown inserted into the test device 12 and connected to the relay tester 39. The test device 12 may include relays or any other components to be tested. The test paddle 10 is illustrated electrically connected to the relay tester 39 via connections 40. The connections 40 may couple to the test paddle 10 using banana jacks 42 inserted into the banana jack adapters 23. The relay tester 39 may be any device that provides electrical signals to the test device 12 via the test paddle 10.

Figure 2A:
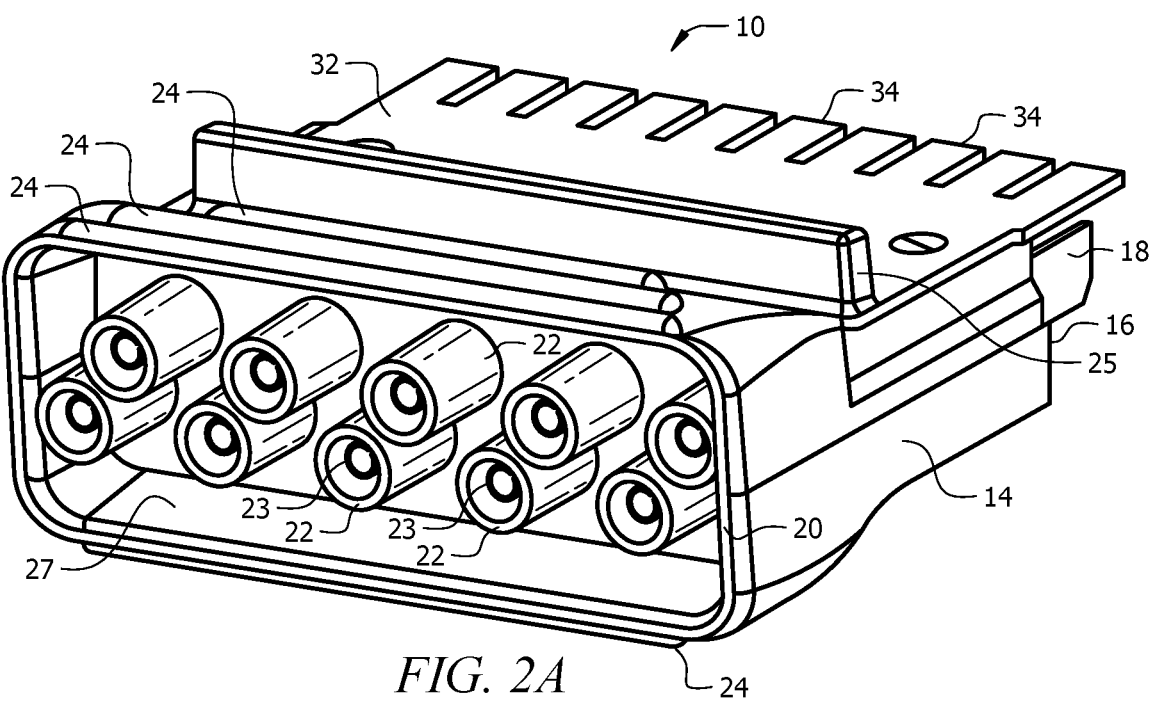
FIGS. 2A-2D depict additional embodiments of the test paddle shown in FIGS. 1A-1B.
Figure 2B:
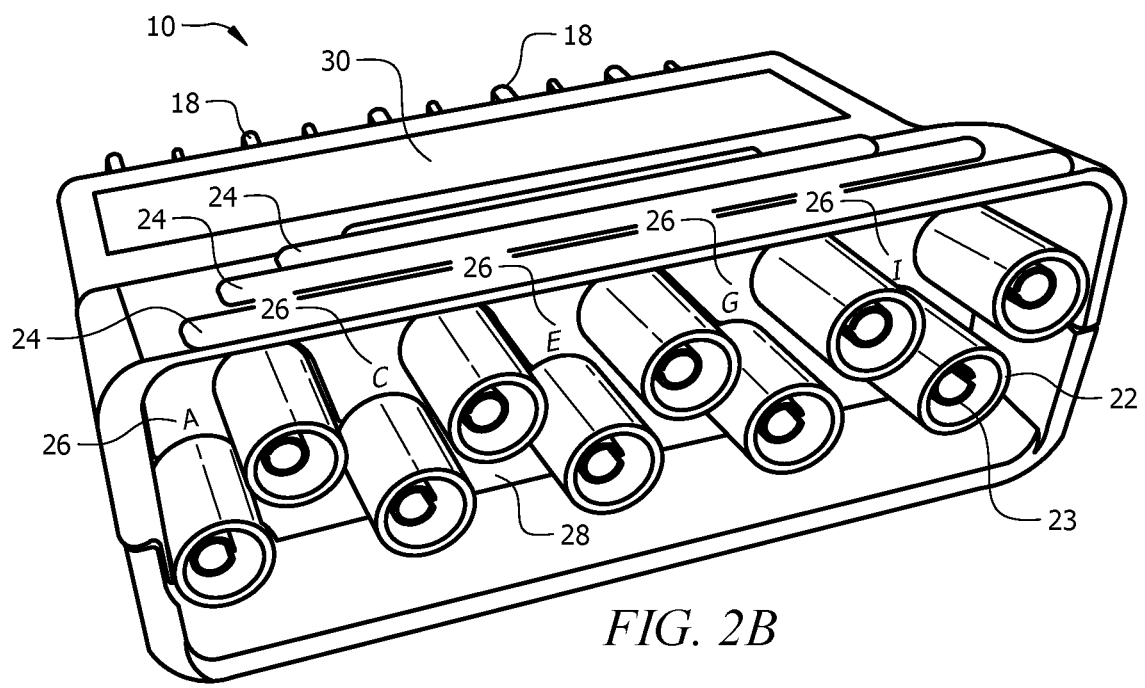
Figure 2C:
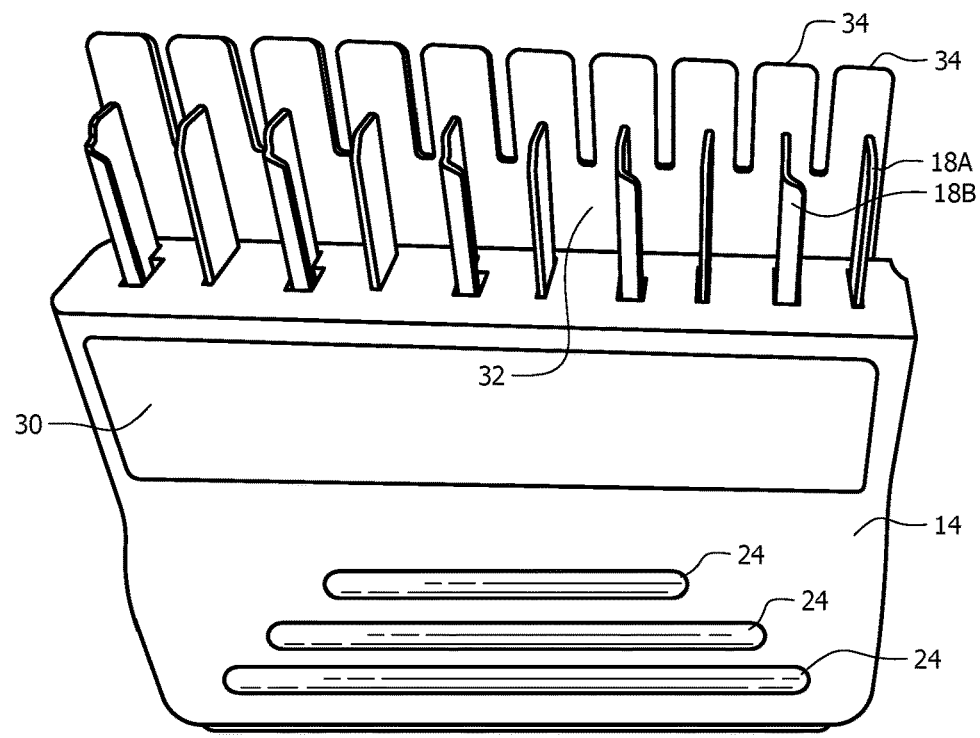
Figure 3:
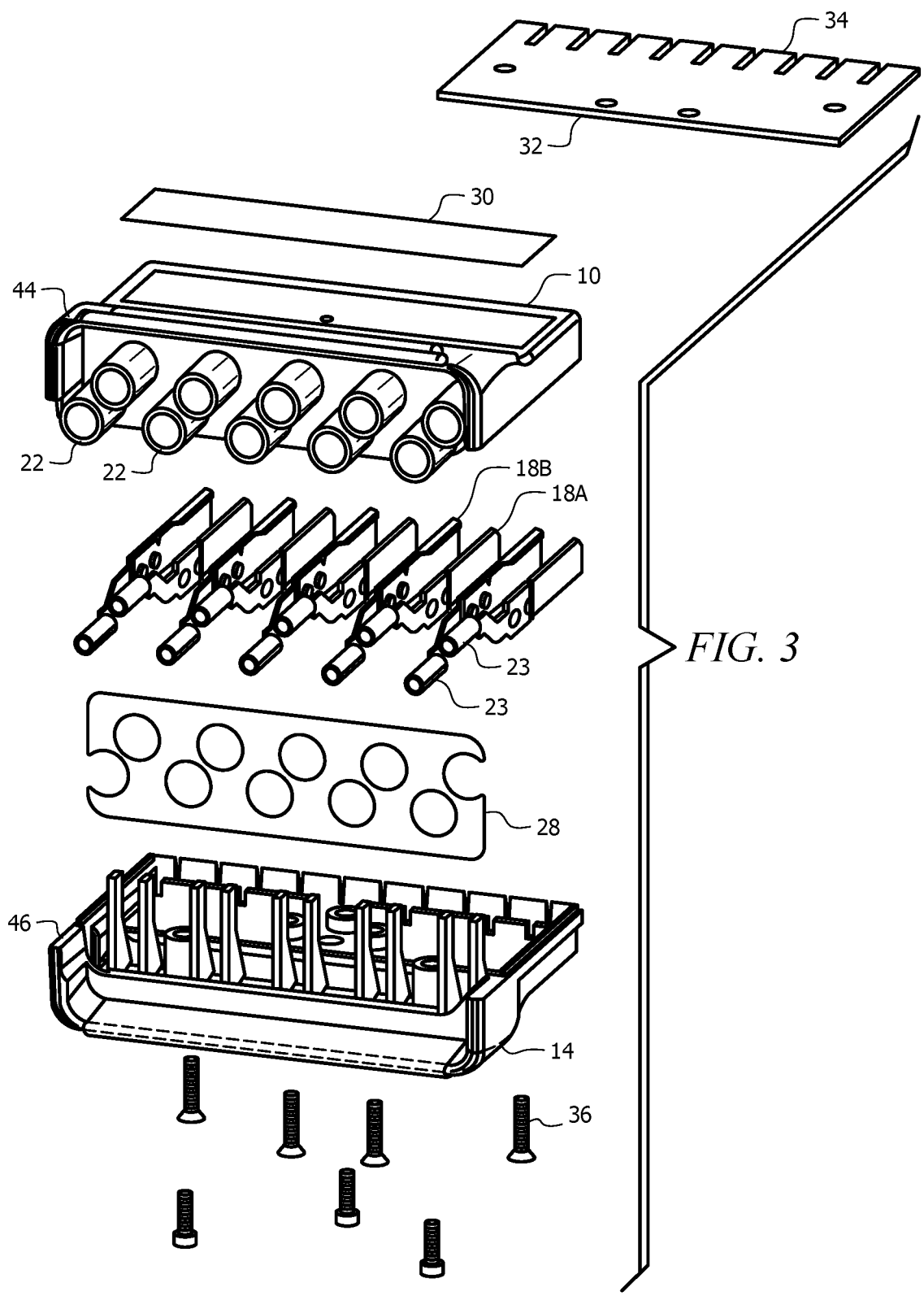
FIG. 3 depicts a perspective view of the test paddle shown in FIGS. 1A-1B and 2A-2D.

As shown in FIGS. 2A and 2B, the second end 20 may define a cavity 27 configured to protect the insulators 22 and banana jack adapters 23, such as from an impact in the event the test paddle 10 is dropped. Further, the second end 20 and cavity 27 may protect the hand of a user of the test paddle 10 from coming into electrical contact with the banana jack adapters 23 during use. The banana jack adapters 23 may include a threaded portion and be constructed of electrically conductive material or any suitable material for serving as a point of connection for banana jacks and testing devices (e.g., test device 12). For example, the banana jack adapters 23 may be configured to accommodate banana jacks, safety plugs, lug adapters, test leads, etc. In other embodiments, other adapters may be implemented when preferred. In general, the banana jack adapters 23 may be substantially similar to banana jack adapters provided on common test paddles. However, the banana jack adapters 23 on such common test panels may be arranged on an upper portion of the test paddle. Consequently, it may not be feasible to simultaneously utilize more than one of these test paddles for a test device comprising more than one row of switches. By comparison, the banana jack adapters 23 of the test paddle 10 disclosed herein are disposed within a cavity 27 defined by the second end 20 (e.g., rather than being disposed atop the body portion 14). As such, multiple test paddles 10 may be arranged above or below one another to test a test device comprising multiple rows of switches.

As previously mentioned, the test paddle 10 is depicted as having ten contacts 18 and banana jack adapters 23, and therefore, is generally sized width-wise to accommodate a 10 panel relay such that multiple test paddles 10 may be used side-by-side to test multiple panels. Multiple test paddles 10 having ten contacts 18 and banana jack adapters 23 may also be used to test one or more panels of different configurations such as testing equipment having 14 panel relays. Alternatively, the test paddle 10 may be configured with fourteen contacts 18 and banana jack adapters 23 to accommodate 14 panel relays. In other words, various embodiments of the test paddle 10 may have different numbers of contacts 18 and banana jack adapters 23 that may vary depending on the type of equipment for which the test paddle 10 may be used (e.g., depending on the number of relays, switches, leads, etc. of the equipment to which the contacts 18 and banana jack adapters 23 may connect).

In some aspects, the body portion 14 may include an uneven or discontinuous surface, such as, but not limited to, a plurality of ridged portions 24 arranged on opposite sides of the second end 20. The ridged portions 24 may allow for improved gripping when the test paddle 10 is grasped by one or more hands of the user. It will be appreciated that considerable force may be necessary when inserting and removing the test paddle 10 into and out of the test device. Moreover, the second end 20 may taper in thickness as the body portion 14 extends from the second end 20 and toward the first end 16, i.e., the second end 20 may be thicker from bottom to top as compared to the first end 16. For example, the combination of the tapered thickness and ridged portions 24 may be such that the second end 20 provides an ergonomic handle to improve an individual's grip on the test paddle 10, and thus, facilitate inserting and removing the test paddle 10 from the test device 12 (e.g., with a single hand). Furthermore, referring to FIG. 2A, the test paddle 10 may comprise a finger guard 25 disposed on a bottom surface of the body portion 14. For example, the finger guard 25 may be configured to prevent a user's hand/fingers from slipping and inadvertently touching electrical components (e.g., relays, contacts 18, or the like) when inserting or removing the test paddle 10 from the test device 12 (or any suitable equipment for which the test paddle 10 may be used).

As best shown in FIG. 2B, the second end 20 may include indicia 26 such as letters or any suitable markings to identify each of the individual banana jack adapters 23. In some aspects, such indicia 26 may be disposed on a cover plate 28 comprising a plurality of cavities 27 through which the banana jack adapters 23 may extend. Furthermore, the test paddle 10 may comprise a label portion 30 to identify or describe the test paddle 10.

Figure 2D:
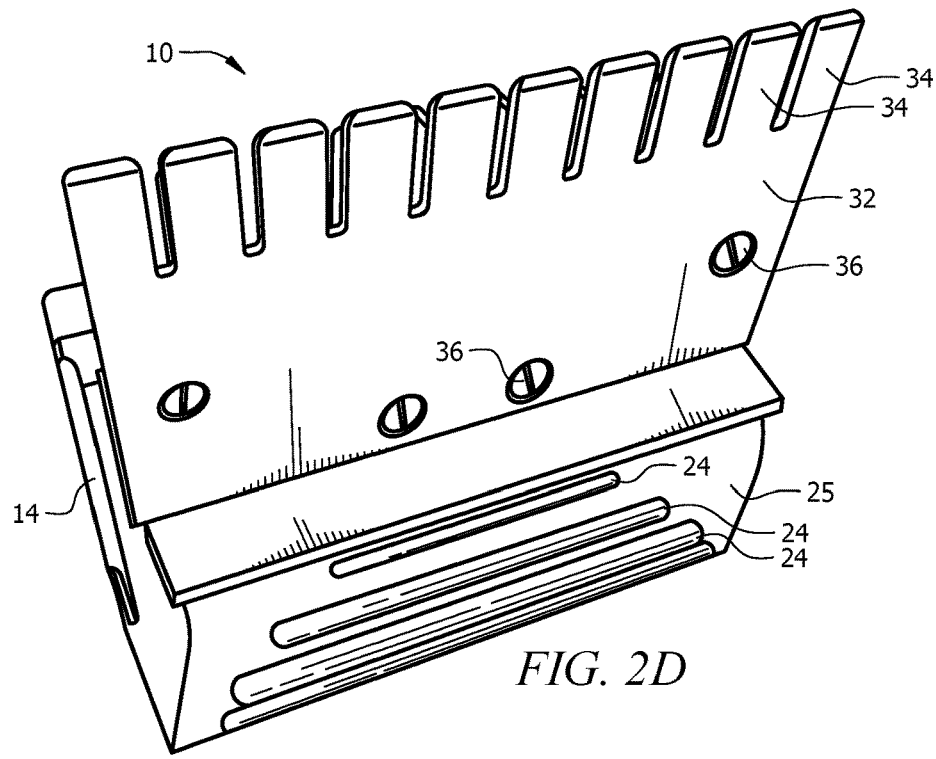

FIGS. 2C and 2D illustrate another embodiment of the test paddle 10. In this embodiment, the test paddle 10 further includes an insulation plate 32 comprising a plurality of finger portions 34, which may extend beyond the plurality of contacts 18 A-B to separate at least part of the contacts 18 A-B from electrical components on the test device 12. The insulation plate 32 may be made of any electrically insulating materials. In some implementations, the insulation plate 32 may be integrated into the test paddle 10. However, the present inventors note that in such implementations, the insulation plate 32 may be subject to wear and the plurality of finger portions 34 may be subject to breakage. In order to alleviate the need to replace the entire test paddle 10 in such cases, the present disclosure provides implementations for removal and replacement of the insulation plate 32 when necessary. For example, the insulation plate 32 may be removable and selectively attached to the body portion 14 via one or more screws 36 (see FIG. 3) or other suitable fasteners. Thus, should the insulation plate 32 become worn or damaged, the insulation plate 32 may be easily removed and replaced by a new insulation plate 32 without requiring replacement of the entire test paddle 10. In the present embodiment, the screws 36 are similarly made of an insulating material.

FIG. 3 depicts the test paddle 10 in a disassembled state. In this view the insulation plate 32 and attachment screws 36 can be seen. This view also depicts the body portion 14 split into an upper portion 44 and lower portion 46 wherein the insulators 22, banana jack adapters 23, and contacts 18 A-B may be provided.

Although the preferred embodiments have been described in detail, it should be understood that various changes, substitutions, and alterations can be made herein without departing from the scope of the present disclosure, even if all of the advantages identified above are not present. For example, the various elements or components may be combined or integrated in another system or certain features may not be implemented.

Also, the components, techniques, systems, sub-systems, layers, compositions and methods described and illustrated in the preferred embodiment as discrete or separate may be combined or integrated with other components, systems, modules, techniques, or methods without departing from the scope of the present disclosure. Other examples of changes, substitutions, and alterations are readily ascertainable by one skilled in the art and could be made without departing from the spirit and scope as disclosed herein.

What is claimed is:

1. A test paddle comprising:
   a body portion having a first end and a second end, the second end located opposite the first end on the body portion;
   a plurality of contacts provided about the first end and configured for connection of the test paddle to a device to be tested;
   a plurality of adapters provided about the second end and configured for connection to a relay tester; and
   a removable insulation plate selectively attached to the body portion and extending from the first end adjacent the plurality of contacts.

2. The test paddle of claim 1, further wherein each of the plurality of adapters are electrically coupled to one of the plurality of contacts.

3. The test paddle of claim 1, wherein the removable insulation plate is coupled to the body portion via one or more removable fasteners.

4. The test paddle of claim 3, wherein the fasteners are threaded.

5. The test paddle of claim 2, wherein the second end of the body portion defines a cavity wherein the plurality of adapters is disposed.

6. The test paddle of claim 2, wherein one or both of an upper or lower surface of the second end of the body portion include an uneven or discontinuous surface.

7. The test paddle of claim 6, wherein one or both of an upper or lower surface of the second end of the body portion include a plurality of ridges.

8. The test paddle of claim 1, further comprising a finger guard positioned between the first end and the second end of the body portion.

9. A test paddle, comprising:
a body portion having a first end and a second end, wherein the second end is on an opposite side of the body portion relative to the first end;
a plurality of adapters provided about the second end;
a plurality of contacts provided about the first end, each of the plurality of adapters electrically coupled to one of the plurality of contacts; and
a removable insulation plate selectively attached to the body portion and extending from the first end adjacent the plurality of contacts.

10. The test paddle of claim 9, wherein the plurality of adapters and plurality of contacts is further defined as being either ten or fourteen adapters and contacts.

11. The test paddle of claim 9, further comprising a finger guard positioned between the first end and the second end of the body portion.

12. The test paddle of claim 9, wherein the in removable insulation plate is attached to the body between the first end and the second end.

13. The test paddle of claim 12, wherein the contacts and the removable insulation plate extend a substantially similar distance from the first end of the body portion.

14. The test paddle of claim 1, wherein the removable insulation plate is coupled to the body portion via one or more removable fasteners.

15. The test paddle of claim 6, wherein one or both of an upper or lower surface of the second end of the body portion include a plurality of ridges.

16. The test paddle of claim 9, wherein the plurality of adapters are provided in a cavity defined by the second end of the body portion of the test paddle.

17. A method for testing relays, comprising:
grasping a first end of a test paddle by a hand of a user;
inserting a contact provided on a second end of the test paddle into a device to be tested; and
connecting a testing device to the test paddle via connections provided on the first end of the test paddle, wherein the test paddle includes a removable insulation plate selectively attached to a body portion of the test paddle adjacent the contacts.

* * * * *